(12) United States Patent
Yuen et al.

(10) Patent No.: US 6,188,279 B1
(45) Date of Patent: Feb. 13, 2001

(54) LOW COST MINIATURE BROADBAND LINEARIZER

(75) Inventors: Cindy H. C. Yuen, Saratoga; Mark D. Adams; James A. Fuchs, both of Santa Clara; Kirk G. Laursen, Stanford; Steve S. Yang, Newark, all of CA (US)

(73) Assignee: Space Systems/Loral, Inc., Palo Alto, CA (US)

( * ) Notice: Under 35 U.S.C. 154(b), the term of this patent shall be extended for 0 days.

(21) Appl. No.: 09/433,128

(22) Filed: Nov. 3, 1999

(51) Int. Cl.[7] .................................................. H03F 1/26
(52) U.S. Cl. ...................... 330/149; 330/304; 375/296; 455/127
(58) Field of Search .................................. 330/149, 304; 375/296, 297; 455/127

(56) References Cited

U.S. PATENT DOCUMENTS

| | | | |
|---|---|---|---|
| 4,752,743 | * 6/1988 | Pham et al. | 330/149 |
| 5,291,148 | * 3/1994 | Reisner et al. | 330/149 |
| 5,789,978 | * 8/1998 | Zhang et al. | 330/149 |
| 5,966,049 | * 10/1999 | Yuen et al. | 330/149 |

* cited by examiner

Primary Examiner—Robert Pascal
Assistant Examiner—Henry Choe
(74) Attorney, Agent, or Firm—Kenneth W. Float

(57) ABSTRACT

A broadband linearizer for use with a power amplifier. The broadband linearizer includes a preamplifier, a postamplifier and a broadband linearizer bridge coupled between the preamplifier and postamplifier. The linearizer bridge comprises a power divider for coupling power to linear and nonlinear arms, and a power combiner for combining outputs of the linear and nonlinear arms. The linear arm includes a first equalizer and a delay line, and the nonlinear arm includes a distortion generator and an attenuator. A second equalizer is coupled between the power combiner and the postamplifier. A control circuit controls settings of the preamplifier, the broadband linearizer bridge, and the postamplifier. The control circuit outputs voltage bias and constant current signals to control operation of the broadband linearizer. The broadband linearizer provides for independent, flexible gain and phase control that can mate with different kinds of power amplifiers, such as travelling wave tube amplifiers and solid state power amplifiers having various gain and phase performance.

19 Claims, 5 Drawing Sheets

Fig. 4
Table 1

Control of gain expansion value

Varying phase difference between two arms, everything else constant (no equalizer or delay lines)

| Phase difference between two arms 30a, 30b | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 165 | | -1.22 | | 7.47 | 7.47 | 33.66 | 33.66 |
| 160 | | -1.22 | | 5.86 | 5.86 | 35.59 | 36.59 |
| 155 | | -1.22 | | 4.60 | 4.60 | 35.71 | 36.71 |

Fig. 5
Table 2

Control of phase advance value

Varying attenuator 36 setting, everything else constant (no equalizer or delay lines)

| Phase difference between two arms 30a, 30b | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | | -0.72 | | 5.86 | 5.86 | 42.11 | 42.11 |
| 160 | | -1.22 | | 5.86 | 5.86 | 35.59 | 35.59 |
| 160 | | -1.72 | | 5.72 | 5.72 | 29.81 | 29.81 |

Fig. 6
Table 3

Control of phase advance with frequency

With linear arm equalizer 32, varying equalization level, everything else constant (no delay lines)

| Phase difference between two arms 30a, 30b | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | 0.5 | -1.22 | | 5.86 | 5.60 | 35.59 | 27.74 |
| 160 | 0.0 | -1.22 | | 5.86 | 5.86 | 35.59 | 35.59 |
| 160 | -0.5 | -1.22 | | 5.86 | 5.78 | 35.59 | 45.59 |

Fig. 7
Table 4

Control of gain expansion with frequency

Linear arm delay line 33 increasing in length, everything else constant (no equalizer)

| Phase difference between two arms 30a, 30b | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | | -1.22 | 0.00 | 5.86 | 5.86 | 35.59 | 35.59 |
| 160 | | -1.22 | -5.00 | 5.86 | 4.08 | 35.59 | 35.40 |
| 160 | | -1.22 | -10.00 | 5.86 | 2.81 | 35.59 | 33.78 |

LOW COST MINIATURE BROADBAND LINEARIZER

BACKGROUND

The present invention relates generally to power amplifiers, and more particularly, to a miniature broadband linearizer for use with power amplifiers.

Heretofore, Lockheed Martin Corporation has developed a broadband linearizer that is implemented using passive FET technology. This broadband linearizer is discussed in a paper entitled "MMIC Linearizers for C and Ku-Band Satellite Applications", by R. Dorval, published in 1998 IEEE MTT-S International Microwave Symposium Workshop".

Nippon Electric Company (NEC) manufactures linearizers for use with power amplifiers. Such linearizers are disclosed in a report entitled "INTELSAT-VII Linearizer for Ku-Band TWTA", and a "Linearizer for Ku-Band TWTA Performance Specification" (Specification No. E021307). The NEC linearizers use commandable switched frequency bands to cover a wide bandwidth. However, the basic design for each band of the NEC linearizers are narrow band. Also, the NEC linearizers use FET amplifiers as nonlinear elements.

Alcatel has developed a linearized channel amplifier that uses a MMIC amplifier as a nonlinear element.

AEG (Daimler-Benz AG) has developed a linearizer preamplifier that includes a nonlinear Schottky diode circuit, a phase shifter and three MMIC amplifiers. This preamplifier is disclosed in a paper entitled "Pseudomorphic Ku-Band GaAs HFET Linearizer Preamplifier Front End for Satellite TWT-Amplifiers", published in the 1995 IEEE GaAs IC Symposium.

In general, however, these conventional linearizers also do not provide for a simple, compact low cost design that does not involve complex commandable switched band selection operation.

Accordingly, it would be advantageous to have a broadband linearizer that may be used with a power amplifier to improve the linearity and efficiency performance of the power amplifier across a wide frequency bandwidth.

SUMMARY OF THE INVENTION

The present invention provides for an improved miniature broadband linearizer that is a nonlinear circuit located before a power amplifier. The broadband linearizer improves the linearity and efficiency performance of the power amplifier across a wide frequency bandwidth.

The present invention provides for an improvement over a broadband linearizer described in U.S. Pat. Application Ser. No. 09/203,257 filed Dec. 1, 1998, entitled "Broadband Linearizer for Power Amplifiers", assigned to the assignee of the present invention. The miniature broadband linearizer provides for a simplified version of this previous broadband linearizer, and uses a simplified bridge circuit, MMIC amplifiers, and a simplified control circuit disposed in a low cost, kovar housing, although other housing materials may be used, such as aluminum or aluminum silicon carbide, for example.

The broadband linearizer may be manufactured using a single level assembly, carrierless package approach. A batch production process may be used to manufacture the broadband linearizer, and a typical lot includes about 20 units. The broadband linearizer may be manufactured in production using automatic assembly and test systems.

Compared to the broadband bridge approach in the previous patent application, this bridge circuit is much simplified, the complex phase shifter circuit is eliminated and a second equalizer after the output combiner is added to flatten the gain performance over a wide frequency band.

The control circuit is simplified in that it has a single bias applied thereto, and has no command and telemetry circuitry. The low cost kovar housing has glass feedthroughs that are used for DC and RF connectors. A limiting function is implemented in the broadband linearizer to improve the linearity performance of the power amplifier near saturation. The low-cost nature of the broadband linearizer is realized by providing RF circuit simplification, including the use of the MMIC amplifiers, a simplified linearizer bridge, which requires minimal circuit tuning, a simplified single bias control circuit and single level carrierless packaging.

The miniature broadband linearizer may be used at any frequency band, including L, C, X, Ku, K, Ka, Q, V or W-band. The reduced to practice embodiment of the broadband linearizer operates over a wide bandwidth, 11.060 to 12.531 GHz in a reduced to practice embodiment. The miniature broadband linearizer also may be used with any type of power amplifier such as a travelling wave tube amplifier (TWTA) or solid state power amplifier (SSPA), for example.

The mass of a reduced to practice embodiment of the linearizer is less than 50 gm. The compact size of a reduced to practice embodiment of the broadband linearizer is 47 millimeters by 48 millimeters by 7 millimeters. The broadband linearizer has low power consumption, and consumes less than 1.2 Watts of DC power. The linearizer characteristics are shaped to complement the characteristics of travelling wave tube amplifiers or solid state power amplifiers to which they are mated as a function of both input power level and frequency.

The broadband linearizer has a simple, compact, low cost design that does not involve complex commandable switched band selection operation as is found in conventional broadband linearizers. When compared certain prior art linearizers, the present linearizer provides for greater broadband performance. The linearizer can compensate the gain and phase of power amplifier over a wide bandwidth (>20%). The broadband linearizer has a simplified control circuit. The linearizer uses a single bias (+8V), and has no command and telemetry functions. The control circuit provides regulated voltage bias to the MMIC amplifiers and temperature compensated current bias to the attenuators.

BRIEF DESCRIPTION OF THE DRAWINGS

The various features and advantages of the present invention may be more readily understood with reference to the following detailed description taken in conjunction with the accompanying drawings, wherein like reference numerals designate like structural element, and in which:

FIGS. 4–7 corresponds to Tables 1–4 and illustrate simulation of various operations of the broadband linearizer of the present invention.

DETAILED DESCRIPTION

Figure 1:
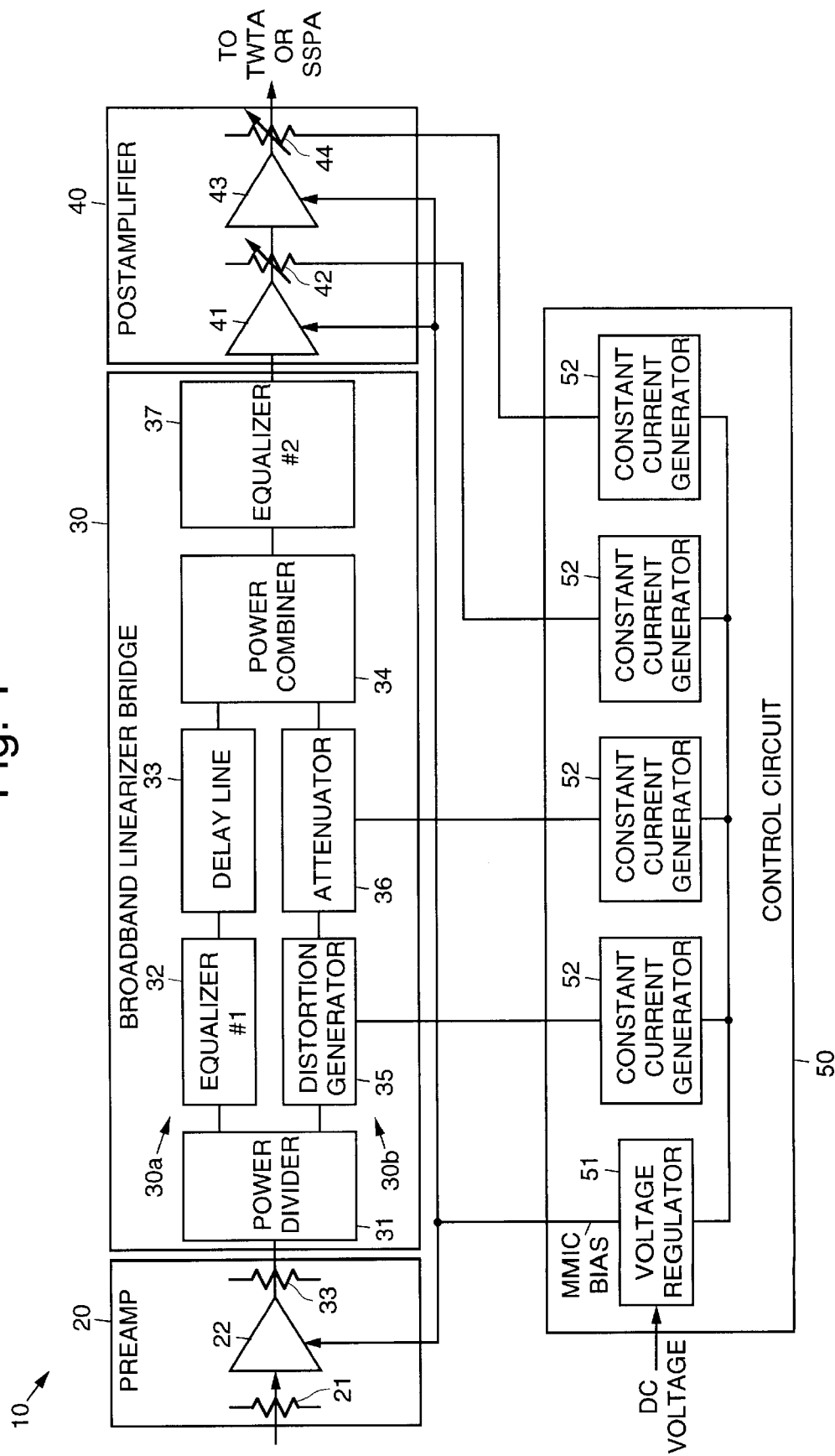
FIG. 1 is a block diagram that illustrates an exemplary miniature broadband linearizer in accordance with the principles of the present invention.

Referring to the drawing figure, it illustrates a block diagram of an exemplary embodiment of a miniature broadband linearizer 10 in accordance with the principles of the present invention. The miniature broadband linearizer 10 comprises a preamplifier 20, a broadband linearizer bridge 30, a postamplifier 40, and a control circuit 50.

The preamplifier 20 comprises an input attenuator 21, a monolithic microwave integrated circuit (MMIC) amplifier 22, and an output attenuator 23. The input and output attenuators 21, 23 may be provided by two pads that are adjusted (trimmed) to provide the proper input power into the linearizer bridge.

The postamplifier 40 comprises a first MMIC amplifier 41, a first attenuator 42, a second MMIC amplifier 43, and an output attenuator 44. The output of the postamplifier 40 is coupled to a power amplifier, such as a travelling wave tube amplifier (TWTA) or solid state power amplifier (SSPA), for example.

The broadband linearizer bridge 30 comprises a power divider 31 and a power combiner 34 interconnected by two paths 30a, 30b or arms 30a, 30b. One arm 30a is a linear arm 30a comprising a first equalizer 32, and a delay line 33. The other arm 30b is a nonlinear arm 30b comprising a distortion generator 35, and an attenuator 36. Outputs of the respective paths 30a, 30b or arms 30a, 30b are combined in the power combiner 34. The output of the power combiner 34 is input to a second equalizer 37. The output of the second equalizer 37 is input to the postamplifier 40.

The control circuit 50 is coupled to the preamplifier 20, the broadband linearizer bridge 30, and the postamplifier 40 and controls the respective settings thereof. In particular, the control circuit 50 includes a voltage regulator 51 and a plurality of constant current generators 52 that cooperate control operation of the broadband linearizer 10.

The voltage regulator 51 generates bias voltages that control operation of the MMIC amplifiers 22, 41, 43 in the preamplifier 20 and postamplifier 40. One of the constant current generators 52 is coupled to the distortion generator 35 in the broadband linearizer bridge 30. A second constant current generator 52 is coupled to the attenuator 26 in the broadband linearizer bridge 30. Third and fourth constant current generators 52 are coupled to the first attenuator 42, and output attenuator 44 in the postamplifier 40.

Figure 2:
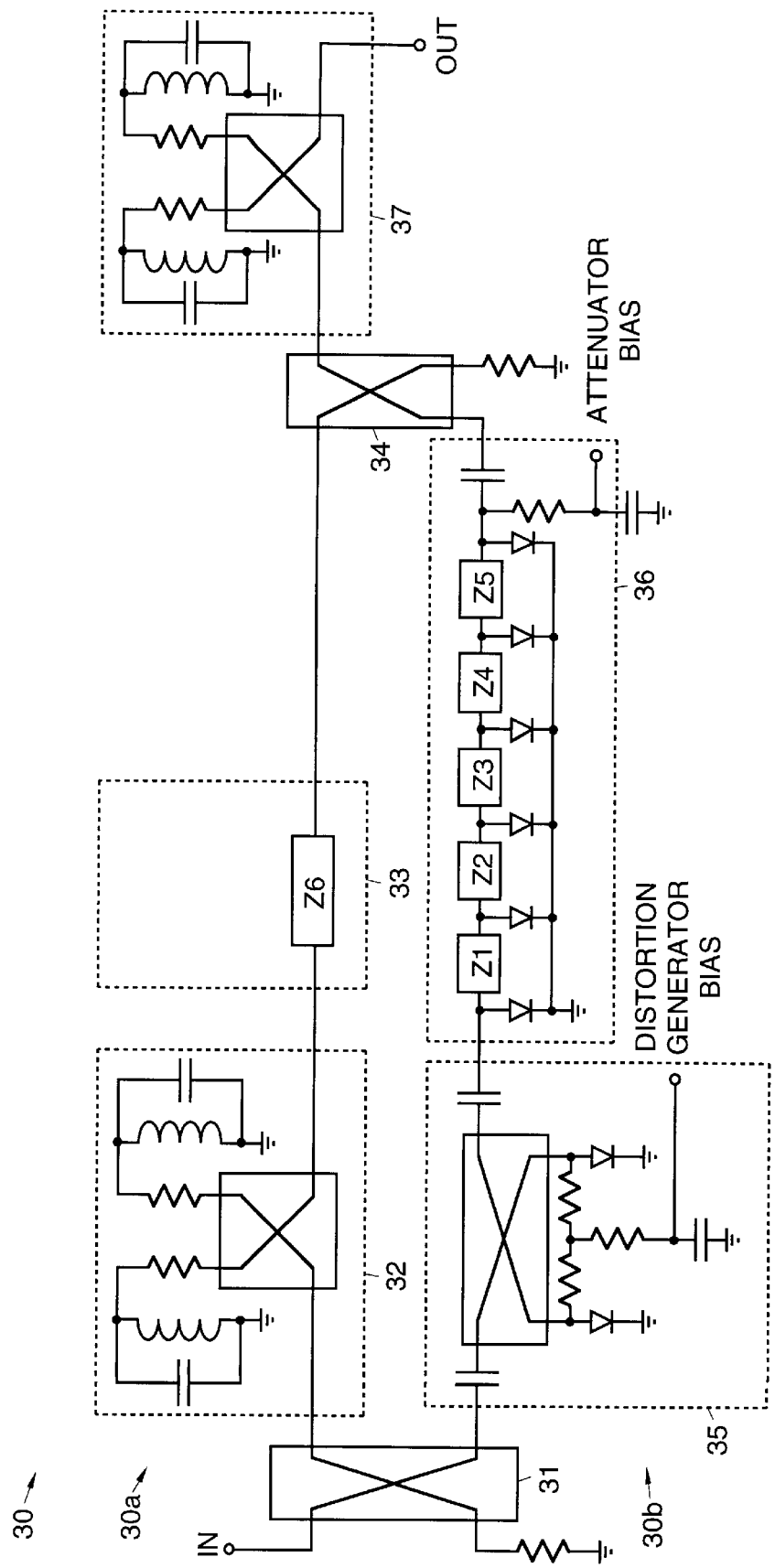
FIG. 2 illustrates a detailed schematic diagram of the exemplary embodiment of the broadband linearizer bridge shown in FIG. 1.

FIG. 2 illustrates a detailed schematic diagram of the exemplary embodiment of the broadband linearizer bridge 30 shown in FIG. 1 The delay line 33 may comprise a bent 50 ohm line, which is employed to compensate the delay between the linear and nonlinear arms 30a, 30b, reduce dispersion and improve the operating frequency band. While the exemplary delay line 33 is a passive circuit, it is to be understood that an active delay line 33 that employs transistor or diode switches, for Example, may also be used in the linearizer 10. The equalizers 32, 37 may comprise passive equalizers 32, 37 containing a RLC network, for example. However, it is to be understood that active equalizers 32, 37 that employ transistors or diodes, for example, may also be used.

The nonlinear distortion generator 35 may comprise a Lange coupler and two diodes that forms a balanced reflection circuit. With properly applied DC bias, this circuit works at low and high power levels. In addition, the gain expansion and phase advance curvature over input power can be easily manipulated by selecting the DC bias level applied to the distortion generator 35.

The attenuator 36 may comprise a plurality of PIN diodes, for example, and is used to adjust the output power of the nonlinear arm 30b. However, while the exemplary attenuator 36 has been disclosed as diode-based, it is to be understood that an attenuator 36 using field effect transistors (FETs), for example, may also be employed.

Similarly, while the exemplary distortion generator 35 uses diodes, it is to be understood that a distortion generator 35 using field effect transistors (FETs), for example may also be employed. Accordingly, the present invention is not limited to the specifically disclosed components discussed with reference to the exemplary embodiment of the linearizer 10.

The linearizer bridge 30 operates as follows. The linearizer bridge 30 has one operational mode: the active mode. In tie active mode, the linearizer bridge 30 functions as a nonlinear circuit that provides up to 10 dB gain expansion with up to 90 degrees phase advance. The phase advance value is controlled by the attenuator 36. The gain expansion value depends on the phase difference of the linear arm 30a and the non-linear arm 30b. By varying this phase difference from 155 degrees to 165 degrees, the gain expansion can be increased from 4.6 dB to 7.47 dB while the phase advance stays around 35 degrees, as shown in the simulation in Table 1 (FIG. 4).

Compared to the approach of the previous patent, the phase shifter circuit is eliminated to simplify the linearizer bridge. In this linearizer design, the linear arm 30a and the non-linear arm 30b circuits are designed such that their phase difference is around 160 degrees, hence the gain expansion is around 5.86 dB. Minor gain expansion adjustment (5 dB–8 dB can be achieved by varying the distortion generator bias slightly. Major gain expansion adjustment (2–10 dB) will involve circuit modifications of the two arms 30a, 30b to vary the phase difference between the two arms.

The operating principles of the broadband linearizer 10 are described below. The distortion generator 35 controls the curvature of gain and phase performance versus input power. The attenuator 36 controls the phase performance of the linearizer bridge 10 over input power. The length of the delay line 33 controls the gain performance of the linearizer bridge 10 over frequency. The first equalizer 32 controls the phase performance of the linearizer bridge 10 over frequency. The second equalizer 37 controls the overall gain slope of the linearizer bridge 10 over frequency.

More particularly, the setting of the distortion generator 35 set by the control circuit 50 controls the curvature of gain expansion (or compression) and phase advance (or lag) versus input power applied to the broadband linearizer 10. The setting (in dB) of the attenuator 36 set by the control circuit 50 controls the phase advance (or lag) versus input power at one frequency. A larger attenuation setting in the nonlinear arm 30b causes a lower phase advance.

The setting (+/–dB/GHz) of the first equalizer 32 is determined by selecting various values of an RLC network and controls the variations of phase advance (or lag) versus input power across a wide frequency bandwidth. A negative gain slope of the first equalizer 32 in the linear arm 30a causes a phase advance (or lag) increase with frequency.

The settings (+/–deg/GHz) of the delay line 33 controls the variations of gain expansion (or compression) versus input power across a wide frequency bandwidth. A longer electrical delay of the linear arm 30a causes a gain expansion (or compression) decrease with frequency.

Simulation of various operations of the broadband linearizer 10 are shown in accompanying Tables 2–4 (FIGS. 5–7)

All results refer to the linearizer gain and phase performance corresponding to the power amplifier saturation point. Table 2 (FIG. 5) shows results for varying attenuator 36 settings while holding everything else constant, Notice the phase advance decreases with increasing attenuation. Table 3 (FIG. 6) shows results for varying equalizer 32 level settings while holding everything else constant. Notice a negative equalizer slope in the linear arm causes a phase advance increase with frequency. Table 4 (FIG. 7) shows the results for varying the linear arm delay line 33 length while holding everything else constant. Notice a longer delay of the linear arm causes a gain expansion decrease with frequency.

The gain of the MMIC amplifier 22 in the preamplifier 20 is adjusted by the control circuit 50 to couple a desired input power level into the broadband linearizer bridge 30. The amplifiers 41, 43 and the attenuators 42, 44 in the postamplifier 40 are adjusted by the control circuit 50 to couple a desired output power level from the broadband linearizer 10 to a travelling wave tube amplifier (TWTA) or solid state power amplifier (SSPA), for example, coupled to an output of the broadband linearizer 10.

By combining the signals from both the linear and nonlinear arms 30a, 30b in the power combiner 34 using appropriate settings as described above, the broadband linearizer 10 can independently compensate the gain and phase requirements over the input power range and across a wide bandwidth for performance requirements of different types of power amplifiers.

The first MMIC amplifier 41 amplifies signal from linearizer bridge 10. The first attenuator 42 adjusts proper power into the second MMIC amplifier 43. The second MMIC amplifier 43 amplifies the signal and also serves as a limiter. The second attenuator 44 adjusts the output signal to provide for proper output power level.

Figure 3:
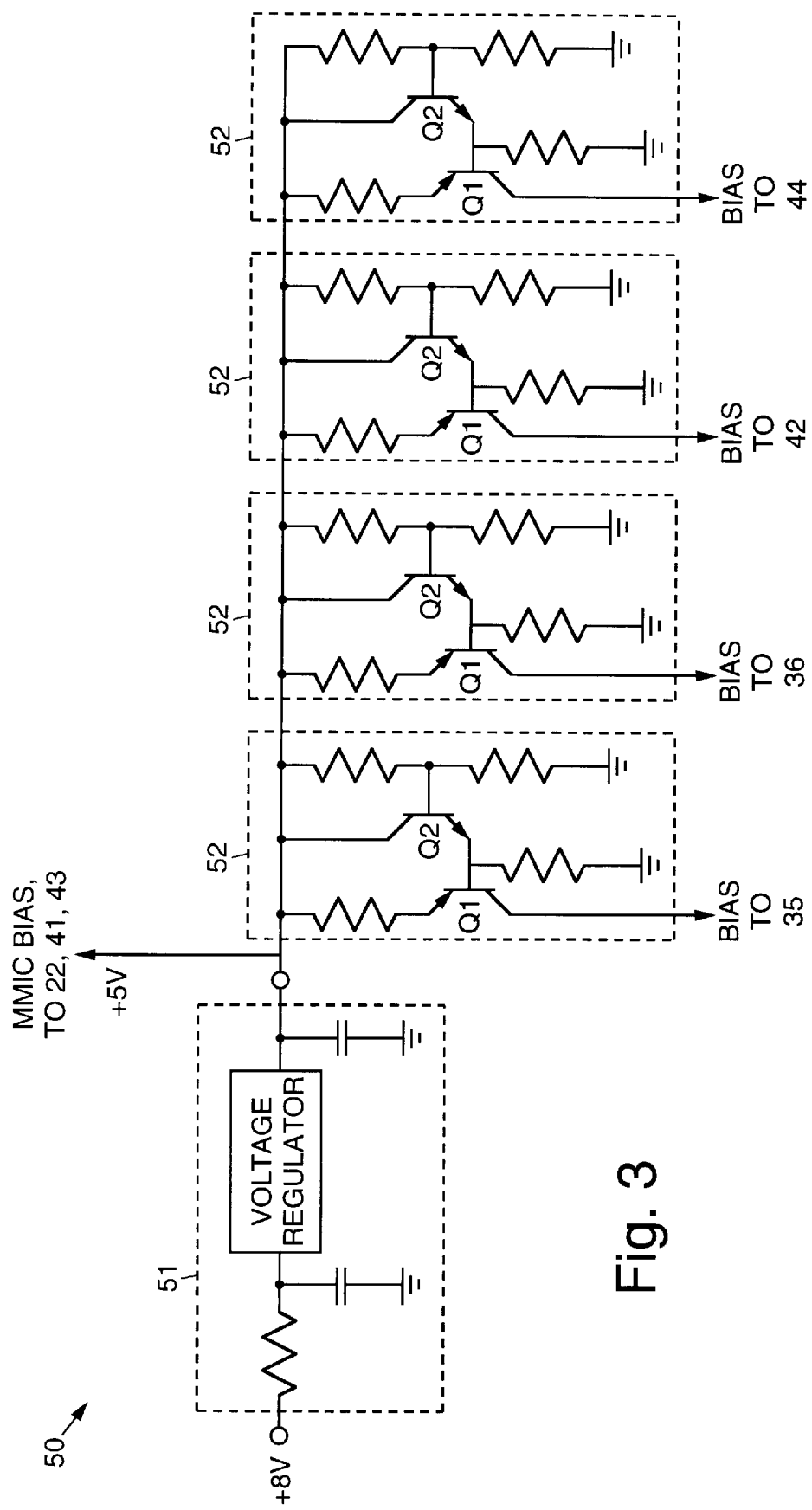
FIG. 3 illustrates a detailed schematic diagram of the exemplary embodiment of the control circuit shown in FIG. 1.

FIG. 3 illustrates a detailed schematic diagram of the exemplary embodiment of the control circuit 50 shown in FIG. 1. The control circuit 50 converts an externally supplied DC voltage into voltages and currents necessary to operate the RF circuits of the linearizer 10. The voltage regulator 51 may be an integrated circuit regulator that generates a constant 5 volt output for the other circuitry. The five volt output is supplied to the three MMIC amplifiers 22, 41, 43 in the RF section and to the constant current generators 52 in the control circuit 50.

Each constant current generator 52 may include two transistors and associated resistors to properly bias the transistors. The constant current generators 52 supply a current that is invariant with changing loads. The resistors in the constant current generators 52 may be regular resistors or temperature-variable resistors if the RF circuits must be temperature compensated. RF circuits including the distortion generator 35, the attenuator 36, and the two variable attenuators 42, 44 in the postamplifier 40 receive current from the constant current generators 52.

The broadband linearizer 10 is designed to use a low cost, miniature kovar housing having glass feedthroughs for DC and RF connectors. However, it is to be understood that other housing materials may be used, such as aluminum or aluminum silicon carbide, for example. The RF circuits (preamplifier 20, bridge 30 and postamplifier 40) and the control circuit 50 are directly attached to the kovar housing and are sealed by a seam-welded hermetic kovar cover.

A production process that may be used to manufacture the broadband linearizer 10 is streamlined to reduce recurring costs. This includes the use of a single level assembly, carrierless packaging, batch production processing of manufacturing lots (with lots typically containing 20 units), and automatic assembly and testing.

The present low cost, miniature broadband linearizer 10 thus provides for a nonlinear circuit located before a power amplifier that is used as to improve the linearity and efficiency performance of the power amplifier across a wide frequency bandwidth. The broadband linearizer 10 may be adapted to process signals in any suitable frequency band, such as L, C, X, Ku, K, Ka, Q, V or W bands. The broadband linearizer 10 may be used with different types of power amplifiers such as travelling wave tube amplifiers (TWTA) and solid state power amplifiers (SSPA), for example.

Thus, a broadband linearizer that may be used with a power amplifier to improve the linearity and efficiency performance of the power amplifier across a wide frequency bandwidth has been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A broadband linearizer for use with a power amplifier, comprising:
   a preamplifier;
   a postamplifier;
   a broadband linearizer bridge coupled between the preamplifier and postamplifier that comprises:
      a power divider for coupling power to linear and nonlinear arms, wherein the linear arm comprises a first equalizer and a delay line, and the nonlinear arm comprises a distortion generator and an attenuator;
      a power combiner for combining outputs of the linear and nonlinear arms; and
      a second equalizer coupled between the power combiner and the postamplifier; and
   a control circuit for controlling respective settings of the preamplifier, the broadband linearizer bridge, and the postamplifier.

2. The linearizer recited in claim 1 wherein the preamplifier comprises an input attenuator, an amplifier, and an output attenuator.

3. The broadband linearizer recited in claim 2 wherein the input and output attenuators 2 comprise pads that are adjusted to provide the proper input power into the linearizer bridge.

4. The broadband linearizer recited in claim 1 wherein the postamplifier comprises a first amplifier, a first attenuator, a second amplifier, and an output attenuator.

5. The broadband linearizer recited in claim 1 wherein the control circuit includes a voltage regulator and a plurality of constant current generators that cooperate control operation of the broadband linearizer.

6. The broadband linearizer recited in claim 5 wherein the voltage regulator generates bias voltages that control operation of the amplifiers in the preamplifier and postamplifier.

7. The broadband linearizer recited in claim 5 wherein the constant current generators are coupled to the distortion generator and the attenuator in the broadband linearizer bridge, and to the first attenuator, and output attenuator in the postamplifier.

8. The broadband linearizer recited in claim 1 whose components are designed for use at frequency bands selected from the group consisting of L, C, X, Ku, K, Ka, Q, and W-band.

9. The broadband linearizer recited in claim 1 wherein the power amplifier comprises a travelling wave tube amplifier.

10. The broadband linearizer recited in claim 1 wherein the power amplifier comprises a solid state power amplifier.

11. The broadband linearizer recited in claim 1 wherein the delay line comprises a bent 50 ohm line, that compensates for the delay between the linear and nonlinear arms, reduce dispersion and improve the operating frequency band.

12. The broadband linearizer recited in claim 1 wherein the delay line comprises a passive delay line.

13. The broadband linearizer recited in claim 1 wherein the delay line comprises a active delay line.

14. The broadband linearizer recited in claim 1 wherein the equalizers comprise passive equalizers.

15. The broadband linearizer recited in claim 1 wherein the equalizers comprise active equalizers.

16. The broadband linearizer recited in claim 1 wherein the nonlinear distortion generator comprises a Lange coupler and two diodes that forms a balanced reflection circuit.

17. The broadband linearizer recited in claim 1 wherein the nonlinear distortion generator comprises a Lange coupler and a plurality of field effect transistors.

18. The broadband linearizer recited in claim 1 wherein the attenuator comprises a plurality of PIN diodes.

19. The broadband linearizer recited in claim 1 wherein the attenuator comprises a plurality of field effect transistors.

* * * * *